(12) United States Patent
Jenkins et al.

(10) Patent No.: US 9,561,604 B2
(45) Date of Patent: Feb. 7, 2017

(54) METHOD AND APPARATUS FOR SKY-LINE POTTING

(75) Inventors: Kenneth Jenkins, Port Monmouth, NJ (US); Kevin A. Hebborn, Toms River, NJ (US); William S. Leib, III, Tinton Falls, NJ (US); David Weimer, Tuckerton, NJ (US)

(73) Assignee: Dialight Corporation, Farmingdale, NJ (US)

( * ) Notice: Subject to any disclaimer, the term of this patent is extended or adjusted under 35 U.S.C. 154(b) by 266 days.

(21) Appl. No.: 13/407,317

(22) Filed: Feb. 28, 2012

(65) Prior Publication Data
US 2013/0221566 A1 Aug. 29, 2013

(51) Int. Cl.
*B29C 39/10* (2006.01)
*H05K 5/06* (2006.01)
*B29K 675/00* (2006.01)
*B29K 683/00* (2006.01)

(52) U.S. Cl.
CPC ............... *B29C 39/10* (2013.01); *H05K 5/064* (2013.01); *B29K 2675/00* (2013.01); *B29K 2683/00* (2013.01); *B29K 2863/00* (2013.01)

(58) Field of Classification Search
USPC .............................. 264/219, 272.13; 249/66.1
See application file for complete search history.

(56) References Cited

U.S. PATENT DOCUMENTS

| 4,480,975 | A | * | 11/1984 | Plummer et al. | 425/116 |
| 5,317,300 | A | * | 5/1994 | Boesel | 336/96 |
| 6,317,324 | B1 | * | 11/2001 | Chen et al. | 361/704 |
| 7,357,886 | B2 | * | 4/2008 | Groth | 264/40.1 |
| 2009/0302496 | A1 | | 12/2009 | Lukis et al. | |
| 2010/0033885 | A1 | | 2/2010 | Hotchkiss et al. | |

FOREIGN PATENT DOCUMENTS

| DE | 10 2001 036910 A1 | 2/2012 |
| EP | 1 487 246 A1 | 12/2004 |
| EP | 1 581 037 A2 | 9/2005 |
| EP | 1 643 818 A1 | 4/2006 |
| JP | 2004111435 A * | 4/2004 |
| JP | 2004 146556 A | 5/2004 |

OTHER PUBLICATIONS

English abstract and machine translation of JP2004111435, 2004.*
PCT Search Report for International Patent Application No. PCT/US2013/028047, dated Apr. 26, 2013, consists of 9 unnumbered pages.

* cited by examiner

*Primary Examiner* — Christina Johnson
*Assistant Examiner* — Xue Liu (57) ABSTRACT

The present disclosure is directed to a method for potting an electrical module. In one embodiment, the method includes placing the electrical component in a potting mold, wherein the potting mold comprises an interior topology that matches a topology of one or more components of the electrical module, filling the potting mold with a potting compound and curing the potting compound over the electrical module.

14 Claims, 5 Drawing Sheets

METHOD AND APPARATUS FOR SKY-LINE POTTING

BACKGROUND

Some electrical modules require potting due to various environmental or operational reasons. Previously, electrical modules would be entirely potted in an even block fashion. Alternatively, the electrical module may be partially potted, leaving some components on the electrical module exposed.

Potting materials may be expensive and relatively heavy. As a result, entirely potting an electrical component in an even block fashion may require excess potting that wastes the potting material and adds excess weight to the electrical module.

SUMMARY

In one embodiment, the present disclosure discloses a method for potting an electrical module. For example, the method includes placing the electrical module in a potting mold, wherein the potting mold comprises an interior topology that matches a topology of one or more components of the electrical module, filling the potting mold with a potting compound and curing the potting compound over the electrical module.

The present disclosure also provides a potting mold. For example, the potting mold includes an interior volume and an outer perimeter coupled to the interior volume, wherein the outer perimeter comprises a shape substantially similar to the electrical module. The interior volume includes a plurality of level surfaces, wherein two or more of the plurality of level surfaces are at different heights that correspond to a topology of two or more components of an electrical module.

The present disclosure also provides another embodiment of a method for potting a power supply. For example, the method includes, fabricating a potting mold, wherein the potting mold has an interior volume that has a plurality of level surfaces, wherein two or more of the plurality of level surfaces are at different heights that correspond to a topology of two or more components of the power supply, filling the potting mold with a potting compound until the interior volume of the potting mold is full, placing the power supply in the potting mold and curing the potting compound over the power supply.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures.

DETAILED DESCRIPTION

As discussed above, some electrical modules require potting due to various environmental or operational reasons. The electrical modules may need to be deployed in harsh or industrial environments. The electrical module may need to be potted to protect the electrical module from shock, high vibrations, prevent high temperatures from operation or to encapsulate the electrical module to prevent explosions in hazardous environments associated with these harsh or industrial environments.

Previously, electrical modules would be entirely potted in an even block fashion. For example, regardless of a topology of the electrical module, the entire electrical module would be potted as a solid block. In other words, the potted electrical module would have a level top. Consequently, some components would receive more potting compound than necessary. For example, if a first component is higher than a second component, then the first component would receive less potting compound than the second component since the potting was applied as a level solid block.

Alternatively, the electrical module may be partially block potted, leaving some components on the electrical module exposed, while the remainder of the electrical module was potted as a single even block.

Potting materials may be expensive and relatively heavy. Consequently, entirely potting an electrical component in an even block fashion may require excess potting that wastes the potting material and adds excess weight to the electrical module. This adds to the overall costs.

Thus, in one embodiment of the present disclosure, the electrical module may be potted with a proper amount of potting for all of the components of the electrical module in a single step. For example, a potting mold may be used that has a substantially similar topology as a topology of the electrical module that is being potted. As a result, the potted electrical module may appear to have a "sky-line." In other words, the topology of all of the components on the electrical module may still be apparent even after the electrical module is fully potted. Thus, the amount of potting compound needed is reduced saving costs and reducing the weight of the potted electrical module.

Figure 1:
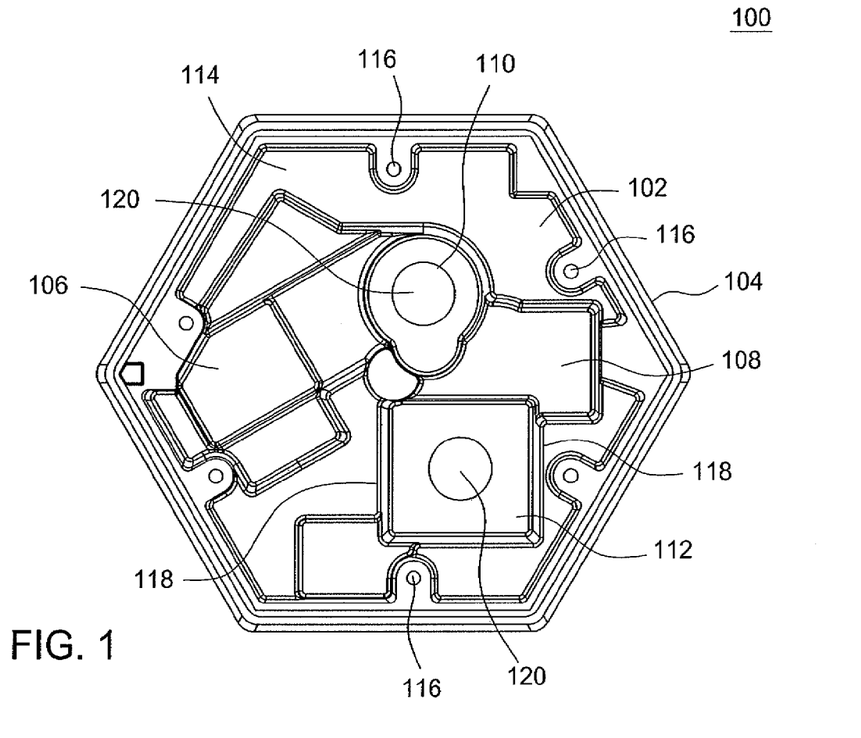
FIG. 1 depicts a top plan view of a potting mold.

FIG. 1 illustrates a top plan view of one embodiment of a potting mold 100 of the present disclosure. In one embodiment, the potting mold 100 may be fabricated from any type of suitable material, for example, a plastic, a metal, a ceramic, and the like. In one embodiment, the potting mold 100 may include an interior volume 102 and an outer perimeter 104 coupled to the interior volume 102.

In one embodiment, the outer perimeter 104 may be shaped to be substantially similar to an outer perimeter of the electrical module that will be potted. For example, if the electrical module has an outer perimeter that is in a shape of a hexagon, the outer perimeter 104 of the potting mold 100 may also be in a shape of a hexagon. Although the outer perimeter 104 in FIG. 1 is illustrated as a hexagon, it should be noted that the outer perimeter 104 may be in any shape (regular or irregular) or polygon, e.g., a square, a rectangle, an octagon, a circle, an irregular shape, and the like.

In one embodiment, the interior volume 102 may include a plurality of levels 106, 108, 110 and 112. Although only four levels are labeled in FIG. 1, it should be noted that the interior volume 102 may have any number of levels in accordance with a topology of the electrical module that the potting mold 100 is created for.

For example, the electrical module may be a power supply having a particular topology created by the various components on the power supply. The components may have various shapes, sizes and heights. For example, some components may be circular and some components may be square or rectangular and some components may be larger or taller than other components. Accordingly, in one embodiment, the plurality of levels 106, 108, 110 and 112 correspond to the shapes, sizes and heights of the various components on the electrical module.

The interior volume 102 may also include one more vertical walls 118 for each one of the plurality of levels 106, 108, 110 and 112. The vertical walls 118 may correspond to a number of walls for each of the components on the electrical module. For example, if a component is a square, there may be four vertical walls 118 for the component. Alternatively, if the component is a circle, there may be a single circular vertical wall 118 for the component.

The combination of the levels 106, 108, 110 and 112 and the corresponding vertical walls 118 form a mold for one or more of the components on the electrical module that needs to be potted. In one embodiment, some of the components may have similar heights. Thus, some of the components may be grouped together. However, there may be different groups of components that have different shapes, sizes and heights. Thus, the levels 106, 108, 110 and 112 and the corresponding vertical walls 118 may form a mold for one or more of the groups of components of the electrical module.

In addition, in some instances, it may be desirable to not pot certain components. As a result, some of the components on the electrical module may not have a corresponding level or vertical wall such that some components do not receive any potting.

In one embodiment, it may be desirable to pot each one of the components on the electrical module. In other words, all of the components may have a corresponding level and vertical walls in the potting mold 100.

As a result, when the electrical module is placed into the potting mold 100, each one of the levels 106, 108, 110 and 112 and the corresponding walls 118 would be in a corresponding, shape, size and height of one of the components on the electrical module. Consequently, when a potting compound is poured into the potting mold 100 with the electrical module the potting compound would be cured in a shape, size and height similar to one or more of the components on the electrical module, thereby, giving the "sky-line" appearance. As a result, an accurate or proper amount of potting compound required to cover the electrical module would be used, which saves costs and reduces the overall weight of the potted electrical module.

In one embodiment, the amount of potting for various components on the electrical module may be controlled by the plurality of levels 106, 108, 110 and 112 and the vertical walls 118. For example, if some components need more protection or require more heat dissipation, the corresponding level for that component may be created in the potting mold 100. For example, if the level 106 is made slightly lower, the corresponding component that fits into an area created by the level 106 and its corresponding vertical walls 118 would receive more potting compound. Similarly, the vertical walls 118 may be spaced slightly wider when the potting mold 100 is created to receive more potting compound on the sides of the component, if needed. Thus, the potting mold 100 may be fabricated to selectively provide different amounts of potting compound coverage for different components of the electrical module in a single step.

In one embodiment, the vertical walls 118 of the potting mold 100 may be slightly inclined with respect to a bottom of the potting mold 100 to help with ease of removal of the potted electrical module. In other words, in one embodiment, the vertical walls 118 and the bottom of the potting mold 100 may be at an angle greater than 90°. One reason to incline the vertical walls 118 is to prevent the sides from grabbing the vertical walls 118 for the entire height of vertical walls 118 while the potted electrical module is being removed from the potting mold 100. This could lead to portions of the potting compound being stripped away from the electrical module during extraction from the potting mold 100. In other embodiments, the vertical walls 118 may be straight, draft or a combination of inclined, straight and/or draft.

In one embodiment, the potting mold 100 may also include one or more masked portions 114. For example, it may not be desirable to pot certain portions or components of the electrical module, such as openings for certain connections. As a result, the masked portions 114 may prevent any potting compound from covering certain areas of the electrical module. For example, specific components of the electrical module may be masked to prevent potting those specific components.

In another embodiment, to avoid applying potting compound on some components, portions of the potting mold 100 may not be filled with potting compound. For example, the level 106 and associated vertical walls 118 may not have any potting compound such that only the components associated with levels 108, 110 and 112 are potted.

In one embodiment, the potting mold 100 may also include one or more means for fastening the potting mold 100 to the electrical module. In one embodiment, the one or more means for fastening may be openings 116 around an edge of the potting mold 100. The openings 116 may receive screws, bolts, clips or other fasteners to couple the electrical module to the potting mold 100.

In one embodiment, the potting mold 100 may also include one or more openings 120. The one or more openings 120 may provide a path to push out the electrical module once the potting compound is cured over the electrical module. In another embodiment, the one or more openings 120 could also be used to provide path for injecting the potting compound into the potting mold 100.

Figure 2:
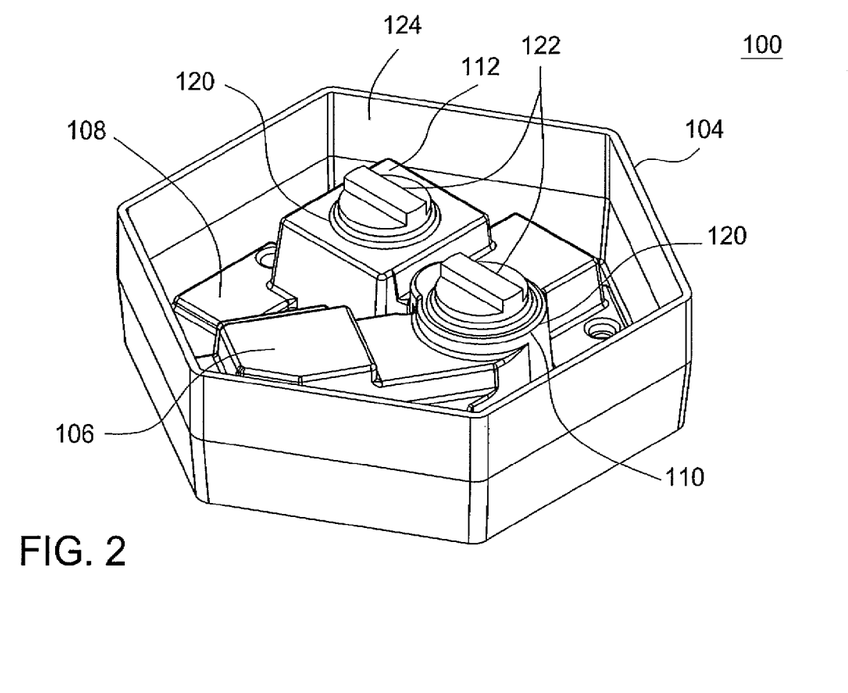
FIG. 2 depicts a bottom isometric view of the potting mold.

FIG. 2 illustrates a bottom isometric view of the potting mold 100. The potting mold 100 may have a bottom side 124. The one or more openings 120 may be on a bottom side 124 of the potting mold. In one embodiment, one or more plugs 122 may be used to plug the one or more openings 120 while the potting mold 100 is filled with the potting compound. As noted above, once the potting compound is cured over the electrical module, the one or more plugs 122 may be removed and the one or more openings 120 may provide a path to push out the electrical module.

Figure 3:
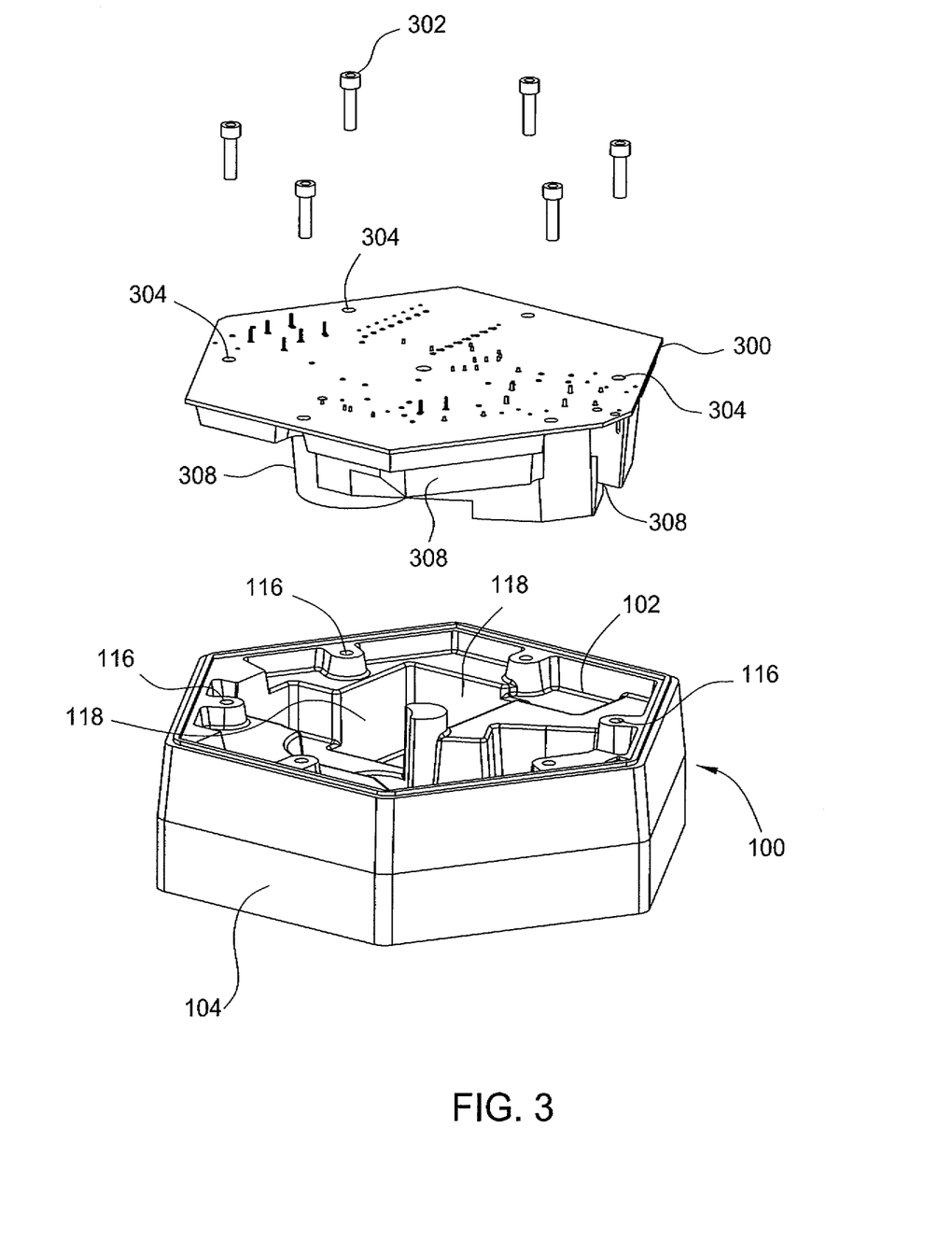
FIG. 3 depicts an exploded isometric view of an electrical module and the potting mold.

FIG. 3 illustrates an exploded isometric view of an electrical module 300 and the potting mold 100. The electrical module 300 may be any type of module that may require potting, e.g., a power supply. The electrical module 300 may include one or more components 308 or groups of components 308 that are potted using the potting mold 100.

In one embodiment, the electrical module 300 may be inserted into the potting mold 100 upside down. The electrical module 300 may have openings in the printed circuit board. As a result, if the potting mold 100 was placed over the electrical module 300 right side up, the potting compound may leak out of the electrical module 300. As a result, placing the electrical module 300 upside down into the potting mold 100 advantageously keeps the potting compound in the potting mold 100 without leaking. It should be noted that FIG. 3 illustrates one example of an "upside down" procedure, but that the electrical module 300 may also be inserted "right side up". Thus, the example in FIG. 3 should not be considered limiting.

In one embodiment, the electrical module 300 may include one or more openings 304 that are aligned with the one or more openings 116 of the potting mold 100. One or more fasteners 302 may be inserted through the one or more openings 304 and the one or more openings 116 to couple the electrical module 300 to the potting mold 100 during the potting procedure. The fasteners may include any type of fasteners such as, for example, screws, nut and bolts, clips, anchors and the like.

Figure 4:
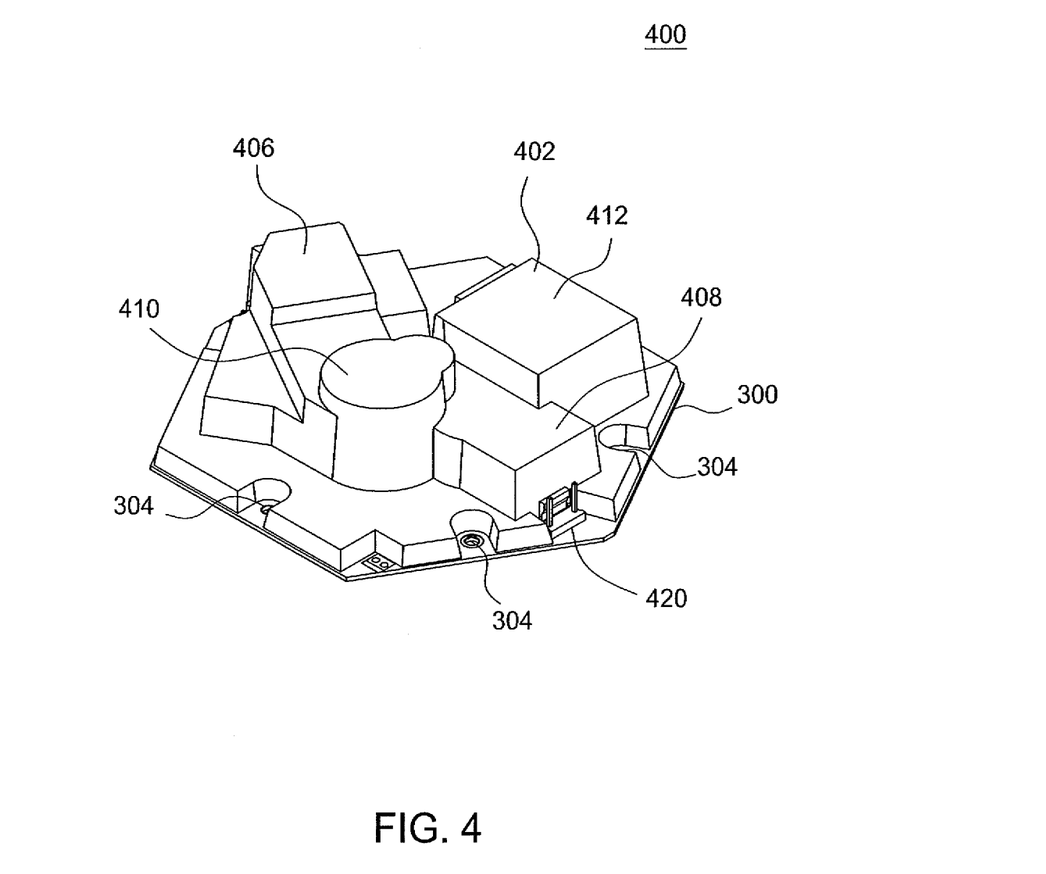
FIG. 4 depicts a top isometric view of a potting compound cured over the electrical module.

FIG. 4 illustrates a top isometric view of a potted electrical module 400. The potted electrical module 400 has a layer of potting compound 402 cured over the electrical module 300. Notably, the topology of the potting compound 402 is substantially similar to the topology of the electrical module 300. For example, each of the potted components 406, 408, 410 and 412 may be identifiable. For example, the potted electrical module 400 shows a "sky-line" of all the electrical components as their different shapes, sizes and levels can all be seen, even after the potting compound 402 is applied.

Moreover, the potting mold 100 is created to ensure that certain features of the electrical module 300 are not covered with the potting compound 402. For example, FIG. 4 illustrates the one or more openings 304 and an electrical connection 420 that has not been covered via the potting process.

As a result, substantial savings is achieved by reducing the amount of potting compound 402 that is needed to cover the entire electrical module 300. In addition, the weight of the potted electrical module 400 is also substantially reduced. In addition, all of this may be achieved in a single step using the potting mold 100 described above. In other words, to achieve the "sky-line" potting, multiple steps are not required.

In addition, by reducing the amount of potting used, the detriment to electromagnetic compatibility (EMC) performance is reduced compared to when full potting methods are deployed. Poor EMC performance can be attributed to the high relative permittivity of potting compounds. Thus, reducing the amount of potting may reduce these effects.

Another advantage of the sky-line potting of the electrical module 300 is the reduction of pressure piling. For example, in a hazardous environment, a fully potted electrical module may block explosion forces that leads to increased pressure causing the fully potted module to fail. In contrast, by shaping the potting compound around one or more components, the force of the explosion could pass by with less obstruction and the pressure would dissipate rather than increase.

Sky-line potting also increases the surface area of the potting compound compared to a full block potting. The increased surface area provides improved convection and radiation of heat to the surrounding air.

In addition, electrical modules are often potted after they are installed into a fixture or a product. The casing that the electrical module is installed in is used to contain the potting while it cures around the electrical module. This prevents easy board replacement in the event of a failure. By potting the electrical module separately, this allows the electrical module to be easily replaceable and to analyze in the event of a failure.

Figure 5:
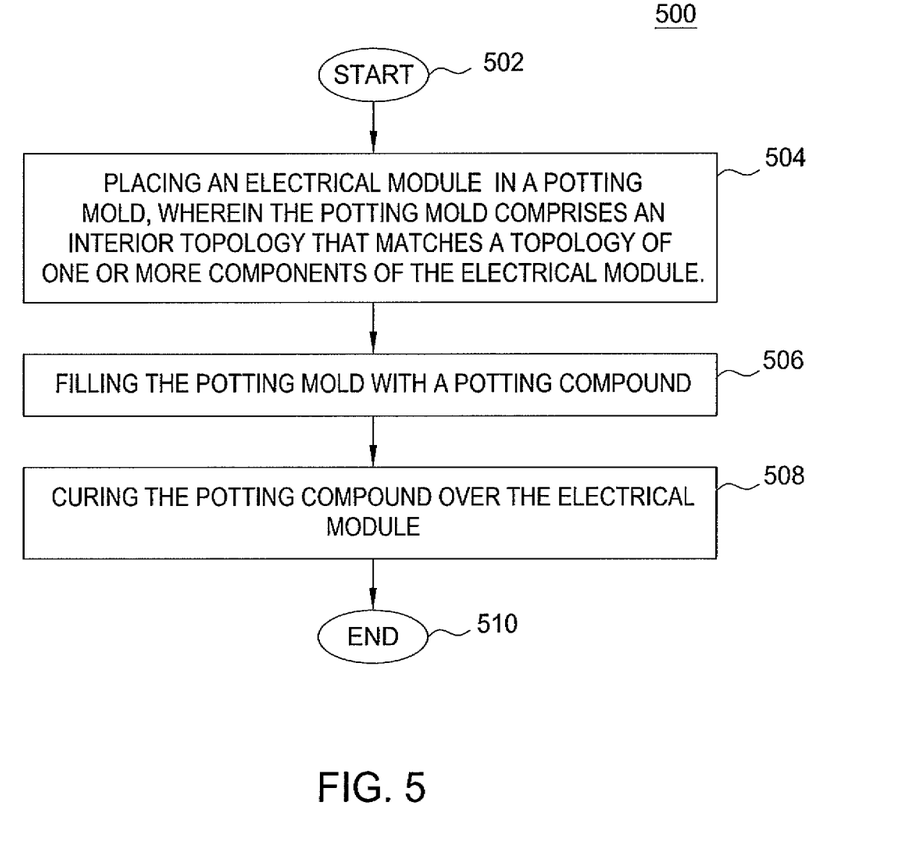
FIG. 5 depicts an example flow diagram of a method for potting an electrical module.

FIG. 5 illustrates a flowchart of a method 500 for potting an electrical module. In one embodiment, the method 500 may be performed by an automated manufacturing facility that is controlled by a general purpose computer having a processor and a non-transitory computer readable medium. For example, the algorithm below may be stored on the non-transitory computer readable medium and executed by the processor and any automated production equipment or physical machinery controlled by the processor.

The method 500 begins at step 502. At step 504, the method 500 places an electrical module in a potting mold, wherein the potting mold comprises an interior topology that matches a topology of a plurality of components of the electrical module. In one embodiment, the electrical component may be a power supply.

In one embodiment, the electrical module may be placed upside down into the potting mold. The electrical module may have openings in the printed circuit board. As a result, if the potting mold was placed over the electrical module right side up, the potting compound may leak out of the printed circuit board of the electrical module. Thus, in one example embodiment, placing the electrical module upside down into the potting mold advantageously keeps the potting compound in the potting mold without leaking. In other embodiments, the electrical module may be placed into the potting mold right side up, for example, if the electrical module has no openings where leaking would not be an issue.

In one embodiment, the topology may be defined as referring to the different shapes, sizes and heights or depths of each one of the components on the electrical module. In one embodiment, "matching" may refer to the fact that the potting mold may have a corresponding portion that is similar to shape, size and height of one or more of the components on the electrical module. In other words, the potting mold is not simply a large open even or level area that is deep enough to fit the largest component. Said another way, the potting mold is not a square planar block. Rather, the potting mold has varying contours and changes in elevation and levels that correspond to the topology of the electrical module.

As noted above, some of the components may have similar heights. Thus, some of the components may be grouped together. However, there may be different groups of components that have different shapes, sizes and heights. Thus, the potting mold may be made to match one or more of the groups of components of the electrical module.

As a result, the amount of potting compound that is used to cover each component may be controlled. For example, the potting mold may be used such that each component on the electrical module may receive an approximately equivalent amount of potting compound. Alternatively, if some components require additional potting compound, the corresponding portion in the potting mold may be created such that those components receive additional amounts of the potting compound. In yet another embodiment, the potting mold selectively choose which components receive potting compound. In other words, the potting mold may be created to selectively determine which components receive potting compound and how much potting compound each component on the electrical module may receive.

For example, some components may tend to operate hotter than other components. In one embodiment, "hotter"

may be defined as operating near a predefined temperature rating for the component. For example, if a component is rated to operate at approximately 50° C. and the component operates within 1-5 degrees of the temperature rating of 50° C., then the component may be considered to be "hotter". As a result, these components may require more potting.

Other components may tend to operate cooler. In one embodiment, "cooler" may be defined as operating well below a predefined temperature rating for the component. For example, if a component is rated to operate at approximately 50° C. and the component operates 10 to 20 degrees lower than the predefined temperature rating, then the component may be considered to be "cooler". These components may require less potting compound. As a result, excess potting compound is not wasted and the overall cost and weight of the potted electrical module may be reduced.

In one embodiment, the electrical module may be fastened to the potting mold. For example, the electrical module may be coupled to the potting mold via one or more screws, nuts and bolts, clips, clamps, and the like.

At step 506, the method 500 fills the potting mold with a potting compound. In one embodiment, the potting compound may comprise any type of material used for potting compounds including, for example, a silicone based potting compound, a polyurethane based compound, a polybutadiene based compound, an epoxy based compound, a urethane based compound and the like. However, any type of potting compounds that are needed for a particular application may be used.

In one embodiment, the potting mold may be filled with the potting compound before the electrical module is coupled to the potting mold. In another embodiment, the potting mold may be filled with the potting compound after the electrical module is coupled to the potting mold. For example, the potting compound may be injected into the potting mold via one or more openings or a lip of the potting mold.

At step 508, the method 500 cures the potting compound over the electrical module. In one embodiment, the potting compound may be oven cured at an increased temperature, e.g., over 25° C. In another embodiment, the potting compound may be cured at room temperature over a longer period of time (e.g., over 24 hours).

After the potting compound is cured, the potted electrical module may be removed from the potting mold. Any excess potting compound may be removed or trimmed away from a top side of the potted electrical module if necessary. The method ends at step 510.

Figure 6:
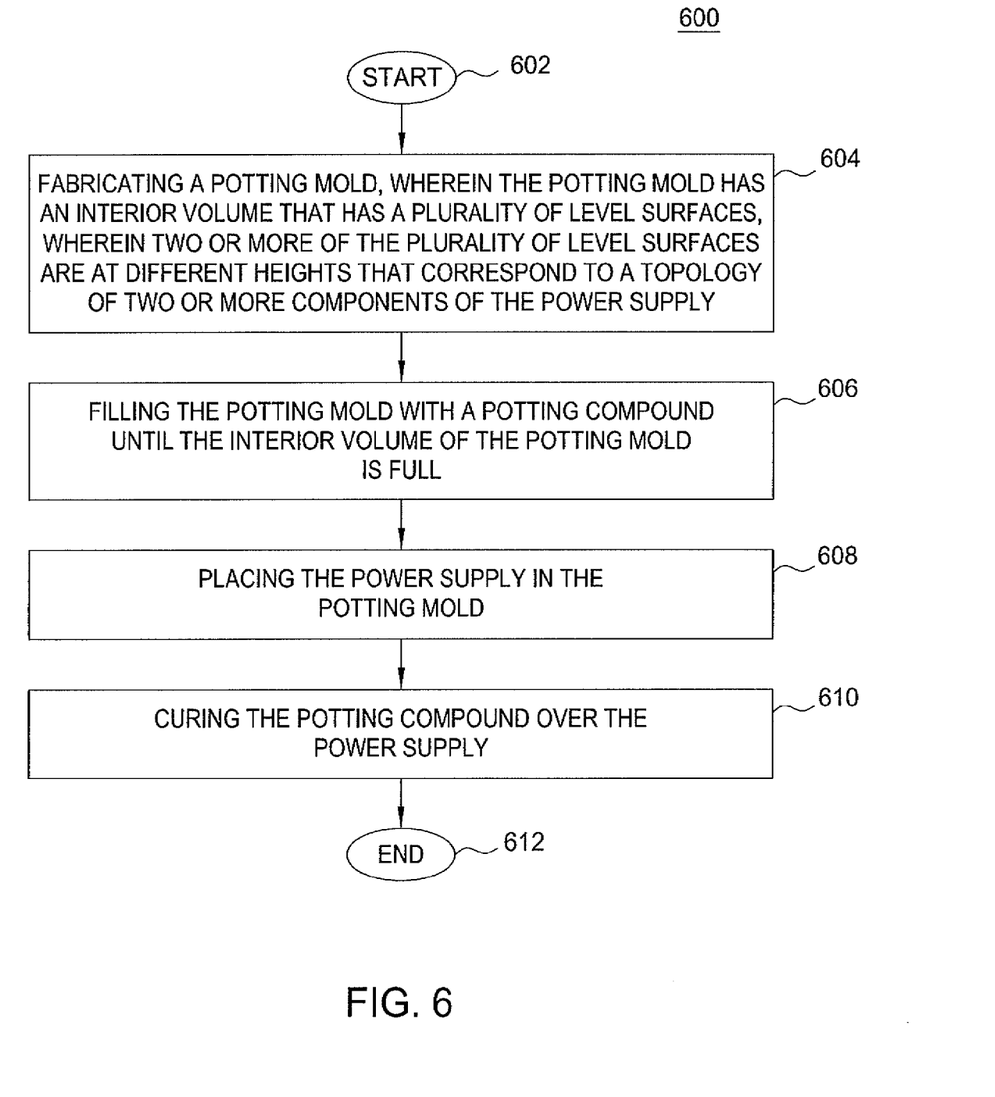
FIG. 6 depicts an example flow diagram of a method for potting a power supply.

FIG. 6 illustrates a flowchart of a method 600 for potting a power supply. In one embodiment, the method 600 may be performed by an automated manufacturing facility that is controlled by a general purpose computer having a processor and a non-transitory computer readable medium. For example, the algorithm below may be stored on the non-transitory computer readable medium and executed by the processor and any automated production equipment or physical machinery controlled by the processor.

The method 600 begins at step 602. At step 604, the method 600 fabricates a potting mold, wherein the potting mold has an interior volume that has a plurality of level surfaces, wherein two or more of the plurality of level surfaces are at different heights that correspond to a topology of a plurality of components of the power supply. The potting mold may be fabricated from any type of suitable material, for example, a plastic, a metal, a ceramic, and the like. The potting mold may include features similar to the potting mold 100 described above in FIGS. 1-4.

At step 606, the method 600 fills the potting mold with a potting compound until the interior volume of the potting mold is full. In one embodiment, the potting mold may have a fill line marked that represents a predetermined volume of potting compound that is needed such that when the electrical module is placed in the potting compound, the potting compound would not overflow out of the potting mold. The potting compound may comprise any type of material used for potting compounds including, for example, a silicone based potting compound, a polyurethane based compound, a polybutadiene based compound, an epoxy based compound, a urethane based compound and the like. However, any type of potting compounds that are needed for a particular application may be used.

At step 608, the method 600 places the power supply in the potting mold. In one embodiment, the power supply may be placed upside down into the potting mold. As discussed above, the power supply may have openings in the printed circuit board. As a result, if the potting mold was placed over the power supply right side up, the potting compound may leak out of the printed circuit board of the power supply. Thus, placing the power supply upside down into the potting mold advantageously keeps the potting compound in the potting mold without leaking.

At step 610, the method 600 may cure the potting compound over the power supply. In one embodiment, the potting compound may be oven cured at an increased temperature, e.g., over 25° C. In another embodiment, the potting compound may be cured at room temperature over a longer period of time (e.g., over 24 hours).

After the potting compound is cured, the potted power supply may be removed from the potting mold. Any excess potting compound may be removed or trimmed away from a top side of the potted power supply if necessary. The method ends at step 612.

It should be noted that although not explicitly specified, one or more steps of the methods 500 and 600 described above may include a storing, displaying and/or outputting step as required for a particular application. In other words, any data, records, fields, and/or intermediate results discussed in the methods can be stored, displayed, and/or outputted to another device as required for a particular application.

In one embodiment, the functions described herein may be performed by a general purpose computer. For example, the computer or computing system may comprise a hardware processor element (e.g., a CPU), a memory, e.g., random access memory (RAM) and/or read only memory (ROM), a module for performing the methods described herein, and various input/output devices, e.g., storage devices, including but not limited to, a tape drive, a floppy drive, a hard disk drive or a compact disk drive, a receiver, a transmitter, a speaker, a display, a speech synthesizer, an output port, and a user input device (such as a keyboard, a keypad, a mouse, and the like).

It should be noted that the present disclosure can be implemented in software and/or in a combination of software and hardware, e.g., using application specific integrated circuits (ASIC), a general purpose computer or any other hardware equivalents, e.g., computer readable instructions pertaining to the method(s) discussed above can be used to configure a hardware processor to perform the steps of the above disclosed method. In one embodiment, the present module or process can be loaded into memory and executed by a hardware processor to implement the functions as discussed above. As such, the present methods, as discussed above, of the present disclosure can be stored on a non-transitory (e.g., tangible or physical) computer readable storage medium, e.g., RAM memory, magnetic or optical drive or diskette and the like.

While the foregoing is directed to embodiments of the present invention, other and further embodiments of the invention may be devised without departing from the basic scope thereof, and the scope thereof is determined by the claims that follow. Various embodiments presented herein, or portions thereof, may be combined to create further embodiments. Furthermore, terms such as top, side, bottom, front, back, and the like are relative or positional terms and are used with respect to the exemplary embodiments illustrated in the figures, and as such these terms may be interchangeable.

The invention claimed is:

1. A method for potting an electrical module, comprising:
placing the electrical module in a potting mold, wherein the potting mold comprises a single component and an interior topology that matches a topology of one or more components of the electrical module, wherein the interior topology comprises a plurality of level surfaces, wherein two or more of the plurality of level surfaces have a different shape, a different size and a different height that correspond to the topology of the one or more components of the electrical module, wherein the potting mold determines an amount of a potting compound is used for each one of the one or more components based on the different shape, the different size and the different height of the plurality of level surfaces and associated vertical walls;
fastening the electrical module to the potting mold via one or more fasteners and one or more first openings around an edge of the electrical module and the potting mold;
filling the potting mold with a potting compound;
curing the potting compound over the electrical module; and
removing the electrical module from the potting mold via one or more second openings that provide a path to push out the electrical module from the potting mold, wherein a topology of the electrical module is still apparent with the potting compound molded to the electrical module.

2. The method of claim 1, wherein the potting compound comprises at least one of: a silicone based compound, a polyurethane based compound, a polybutadiene based compound, an epoxy based compound or a urethane based compound.

3. The method of claim 1, wherein the filling comprises:
filling the potting mold with the potting compound before the electrical module is placed in the potting mold.

4. The method of claim 1, wherein the filling comprises:
filling the potting mold with the potting compound via the one or more second openings in the potting mold after the electrical module is placed in the potting mold.

5. The method of claim 1, wherein the curing comprises oven curing at a temperature greater than 25° C.

6. The method of claim 1, wherein the potting mold is fabricated from at least one of: a plastic, a metal or a ceramic.

7. The method of claim 1, wherein the electrical module comprises a power supply.

8. The method of claim 1, wherein the potting mold provides more of the potting compound to a first one or more components that tend to operate near a respective predefined temperature rating for the first one or more components than to a second one or more components that tend to operate significantly below a respective predefined temperature rating of the second one or more components.

9. A potting mold, comprising:
an interior volume, wherein the interior volume comprises:
a plurality of level surfaces, wherein two or more of the plurality of level surfaces are at different heights and have different shapes, wherein each one of the plurality of level surfaces corresponds to a topology of each one of a plurality of components of an electrical module that is potted, wherein the potting mold determines an amount of a potting compound is used for each one of the plurality of components based on the different heights and the different shapes of the plurality of level surfaces and associated vertical walls;
an outer perimeter coupled to the interior volume, wherein the outer perimeter comprises a shape substantially similar to the electrical module;
one or more first openings around an edge of the outer perimeter to receive a fastener to couple the potting mold to the electrical module, wherein the potting compound is applied between a single component of the potting mold and the electrical module; and
one or more second openings to provide a path to push out the electrical module from the potting mold.

10. The potting mold of claim 9, wherein the one or more second openings are plugged while the potting mold is filled with the potting compound.

11. The potting mold of claim 9, wherein the potting mold comprises at least one of: a plastic, a metal or a ceramic.

12. The potting mold of claim 9, wherein one or more portions of the potting mold are masked to prevent the potting compound from being applied to a corresponding one or more portions of the electrical module.

13. The potting mold of the claim 9, wherein each vertical wall of each one of the plurality of level surfaces is formed at an incline.

14. A method for potting a power supply, comprising:
fabricating a potting mold, wherein the potting mold comprises a single component and has an interior volume that has a plurality of level surfaces, wherein two or more of the plurality of level surfaces are at different heights, different shapes and different sizes that correspond to a topology of two or more components of the power supply, wherein the potting mold determines an amount of a potting compound is used for each one of the two or more components based on the different heights, the different shapes and the different sizes of the plurality of level surfaces and associated vertical walls;
fastening the electrical module to the potting mold via one or more fasteners and one or more first openings around an edge of the electrical module and the potting mold;
filling the potting mold with a potting compound until the interior volume of the potting mold is full;
placing the power supply in the potting mold;
curing the potting compound over the power supply; and
removing the power supply from the potting mold via one or more second openings that provide a path to push out the electrical module from the potting mold, wherein a topology of the power supply is still apparent with the potting compound molded to the power supply.

* * * * *

UNITED STATES PATENT AND TRADEMARK OFFICE
CERTIFICATE OF CORRECTION

PATENT NO. : 9,561,604 B2
APPLICATION NO. : 13/407317
DATED : February 7, 2017
INVENTOR(S) : Kenneth Jenkins et al.

Page 1 of 1

It is certified that error appears in the above-identified patent and that said Letters Patent is hereby corrected as shown below:

In the Claims

Column 10, Line 37, Claim 13, after mold of delete "the", therefor.

Column 10, Line 53, Claim 14, after fastening the delete "electrical module" and insert -- power supply --, therefor.

Column 10, Line 55, Claim 14, after an edge of the delete "electrical module" and insert -- power supply --, therefor.

Column 10, Line 62, Claim 14, after the delete "electrical module" and insert -- power supply --, therefor.

Signed and Sealed this
Twenty-fourth Day of April, 2018

Andrei Iancu
*Director of the United States Patent and Trademark Office*